United States Patent
Yang et al.

(10) Patent No.: US 7,749,873 B2
(45) Date of Patent: Jul. 6, 2010

(54) POLYCRYSTALLINE SILICON LAYER, FLAT PANEL DISPLAY USING THE SAME, AND METHODS OF FABRICATING THE SAME

(75) Inventors: Tae-Hoon Yang, Suwon-si (KR); Ki-Yong Lee, Suwon-si (KR); Jin-Wook Seo, Suwon-si (KR); Byoung-Keon Park, Suwon-si (KR)

(73) Assignee: Samsung Mobile Display Co., Ltd., Nongseo-Dong, Giheung-Gu, Yongin, Gyunggi-Do (KR)

( * ) Notice: Subject to any disclaimer, the term of this patent is extended or adjusted under 35 U.S.C. 154(b) by 0 days.

(21) Appl. No.: 11/636,964

(22) Filed: Dec. 12, 2006

(65) Prior Publication Data

US 2007/0131933 A1   Jun. 14, 2007

(30) Foreign Application Priority Data

Dec. 13, 2005   (KR) .................. 10-2005-0122627

(51) Int. Cl.
*H01L 21/20* (2006.01)
(52) U.S. Cl. .................. 438/486; 257/E21.133
(58) Field of Classification Search .......... 438/486, 438/479; 257/E21.133
See application file for complete search history.

(56) References Cited

U.S. PATENT DOCUMENTS

| | | | | |
|---|---|---|---|---|
| 5,821,562 | A * | 10/1998 | Makita et al. | 257/64 |
| 5,851,860 | A * | 12/1998 | Makita et al. | 438/166 |
| 5,970,327 | A * | 10/1999 | Makita et al. | 438/166 |
| 6,162,667 | A * | 12/2000 | Funai et al. | 438/166 |
| 6,784,455 | B2 * | 8/2004 | Maekawa et al. | 257/66 |
| 6,919,237 | B2 * | 7/2005 | Ohtani et al. | 438/151 |
| 7,071,083 | B2 * | 7/2006 | Lin | 438/487 |
| 2003/0001158 | A1 * | 1/2003 | Yamazaki et al. | 257/64 |

(Continued)

FOREIGN PATENT DOCUMENTS

JP   2000-068203   3/2000

(Continued)

OTHER PUBLICATIONS

Dictionary.com American Heritage Dictionary entry, Mar. 18, 2008.*

(Continued)

*Primary Examiner*—Hsien-ming Lee
*Assistant Examiner*—Kevin Parendo
(74) *Attorney, Agent, or Firm*—Robert E. Bushnell, Esq.

(57) ABSTRACT

A polycrystalline silicon layer, a flat panel display using the polycrystalline silicon layer, and methods of fabricating the same are provided. An amorphous silicon layer is formed on a substrate. A first pattern layer, a second pattern layer, and a metal catalyst layer are formed on the amorphous silicon layer. The first pattern layer and the second pattern layer are formed to define a region of at least 400 $\mu m^2$ within which a metal catalyst of the metal catalyst layer is diffused into the amorphous silicon layer. A seed region is crystallized by the diffused metal catalyst. After a crystallization region is grown from the seed region, a semiconductor layer is formed on the crystallization region, so as to fabricate a thin film transistor with excellent characteristics. Using this, a flat panel display is fabricated.

26 Claims, 10 Drawing Sheets

U.S. PATENT DOCUMENTS

| | | | |
|---|---|---|---|
| 2004/0235276 A1 | 11/2004 | Lin | |
| 2005/0009262 A1* | 1/2005 | Takemura et al. | 438/202 |
| 2005/0072754 A1* | 4/2005 | Shih et al. | 216/23 |
| 2005/0172888 A1* | 8/2005 | Gosain et al. | 117/87 |

FOREIGN PATENT DOCUMENTS

| | | |
|---|---|---|
| JP | 2004-186683 | 7/2004 |
| JP | 2004-193593 | 7/2004 |
| KR | 10-2001-0078788 | 8/2001 |

OTHER PUBLICATIONS

*Office Action* from the Chinese Patent Office issued in Applicant's corresponding Chinese Patent Application No. 200610166981.2 dated May 30, 2008.

Korean Patent Registration Gazette issued by the Korean Intellectual Property Office on May 18, 2007 in Applicant's corresponding Korean patent application No. 10-2005-0122627.

* cited by examiner

POLYCRYSTALLINE SILICON LAYER, FLAT PANEL DISPLAY USING THE SAME, AND METHODS OF FABRICATING THE SAME

CLAIM OF PRIORITY

This application makes reference to, incorporates the same herein, and claims all benefits accruing under 35 U.S.C. §119 from an application for POLYCRYSTALLINE SILICON LAYER, FLAT PANEL DISPLAY USING THE SAME, AND METHODS OF FABRICATING THE SAME earlier filed in the Korean Intellectual Property Office on the 13$^{th}$ of December 2005 and there duly assigned Serial No. 10-2005-122627.

BACKGROUND OF THE INVENTION

1. Field of the Invention

The present invention relates to a polycrystalline silicon layer, a flat panel display using the same, and methods of fabricating the same, and more particularly, the present invention relates to a polycrystalline silicon layer, a flat panel display using the same, and methods of fabricating the same in which when an amorphous silicon layer is crystallized into the polycrystalline silicon layer, a seed region is crystallized using a Super Grain Silicon (SGS) crystallization technique to have an area of 400 μm$^2$ or more, the crystallinity of the seed region is enhanced to become a crystallization region, the crystallization region is patterned into a semiconductor layer, and the flat panel display is manufactured using the semiconductor layer.

2. Description of the Related Art

A thin film transistor used in a flat panel display, such as an organic electroluminescent device, is manufactured by depositing an amorphous silicon layer on a transparent substrate, such as a glass or Si substrate, dehydrogenating the amorphous silicon layer, ion-implanting impurities for forming a channel, crystallizing the amorphous silicon layer to form a polycrystalline silicon layer, and then patterning the polycrystalline silicon layer to fabricate a semiconductor layer.

Methods of crystallizing the amorphous silicon layer into a polycrystalline silicon layer include Solid Phase Crystallization (SPC), Excimer Laser Crystallization (ELC), Metal Induced Crystallization (MIC), and Metal Induced Lateral Crystallization (MILC). SPC is a method of annealing an amorphous silicon layer for several to several tens of hours at a temperature of about 700° C. or less, which is a transition temperature of glass used as a substrate of a display device employing a thin film transistor. ELC is a method of crystallizing a silicon layer by irradiating it with an excimer laser and locally heating it to a high temperature for a very short time, and MIC is a method of using phase transfer induction from amorphous silicon to polysilicon by contacting the amorphous silicon layer with metals, such as Ni, Pd, Au and Al, or implanting such metals into the amorphous silicon layer. MILC involves a technique of inducing sequential crystallization of silicon by lateral diffusion of silicide formed by reacting metal with the silicon.

However, polycrystalline silicon layers crystallized by these methods are non-uniform with respect to thin film transistor characteristics, such as threshold voltage and off-characteristics, due to non-uniform grain size and irregular distribution of grain boundaries.

SUMMARY OF THE INVENTION

The present invention provides a polycrystalline silicon layer with superior characteristics by crystallizing a predetermined region, in which a thin film transistor will not be formed, using a Super Grain Silicon (SGS) technique, causing the crystallinity of the predetermined region crystallized using the SGS technique to spread to a region where the thin film transistor will be formed and to crystallize it, and obtaining a uniform grain size and a regular distribution of grain boundaries. The present invention also provides a flat panel display using the polycrystalline silicon layer.

An exemplary embodiment of the present invention provides a polycrystalline silicon layer, including: a substrate; a seed region at least 400 μm$^2$ in size; and a crystallization region grown from the seed region, the crystallization region and the seed region being located on the substrate.

The seed region is preferably crystallized using a Super Grain Silicon (SGS) crystallization technique. The seed region is preferably square-shaped. The seed region preferably includes a seed.

The crystallization region is preferably crystallized by growth of the seed region. Directions of grain boundaries in the seed region are preferably random. Grain boundaries of the crystallization region are preferably formed radially centered on the seed region.

The seed preferably includes a metal catalyst. The metal catalyst preferably has a concentration of 1×10$^{13}$ atoms/cm$^2$ or less.

The seed region preferably includes: a first pattern layer arranged on the amorphous silicon layer to expose a predetermined region of the amorphous silicon layer; a second pattern layer arranged on the first pattern region and contacting the predetermined region of the amorphous silicon layer; and a metal catalyst layer arranged on the second pattern layer; the substrate with the first pattern, the second pattern and the metal catalyst is heat-treated and the exposed predetermined region of the amorphous silicon layer is crystallized to form the seed region.

The first pattern layer preferably includes a silicon oxide layer. The silicon oxide layer preferably has a thickness in a range of 50 to 5,000 Å. The second pattern layer preferably includes a silicon nitride layer. The silicon nitride layer preferably has a thickness in a range of 50 to 5,000 Å.

The seed region preferably includes: a second pattern layer arranged on the amorphous silicon layer; a first pattern layer arranged on the second pattern layer and exposing a predetermined region of the amorphous silicon layer; and a metal catalyst layer arranged on the second pattern layer; the substrate with the second pattern, the first pattern and the metal catalyst is heat-treated and the exposed predetermined region of the amorphous silicon layer is crystallized to form the seed region.

The first pattern layer preferably includes a silicon oxide layer. The silicon oxide layer preferably has a thickness in a range of 50 to 5,000 Å. The second pattern layer preferably includes a silicon nitride layer. The silicon nitride layer preferably has a thickness in a range of 50 to 5,000 Å.

Another exemplary embodiment of the present invention provides a method of fabricating a polycrystalline silicon layer, the method comprising: forming an amorphous silicon layer on a substrate; forming a first pattern layer exposing at least 400 μm$^2$ of the amorphous silicon layer; forming a second pattern layer contacting the amorphous silicon layer exposed by the first pattern layer; forming a metal catalyst layer on the second pattern layer; and heat-treating the substrate to form a seed in the exposed amorphous silicon layer, to crystallize the exposed amorphous silicon layer to form a seed region from the seed, and to cause the crystallinity of the seed region to spread to regions other than the exposed amorphous silicon layer to crystallize these regions into a crystallization region.

Heat-treating the substrate is preferably performed at a temperature in a range of 400 to 800° C. for 1 to 3,000 minutes. The first pattern layer preferably includes a silicon oxide layer and the second pattern layer includes a silicon nitride layer. The metal catalyst layer preferably includes a metal catalyst in a concentration in a range of $10^{11}$ to $10^{15}$ atoms/cm$^2$.

Still another exemplary embodiment of the present invention provides a method of fabricating a polycrystalline silicon layer, the method comprising: forming an amorphous silicon layer on a substrate; forming a second pattern layer on the amorphous silicon layer; forming a first pattern layer on the substrate to expose at least 400 μm$^2$ of the second pattern layer; forming a metal catalyst layer on the substrate; and heat-treating the substrate to form a seed in the amorphous silicon layer corresponding to the exposed second pattern layer, to crystallize the exposed amorphous silicon layer to form a seed region from the seed, and to cause the crystallinity of the seed region to spread to regions other than the exposed amorphous silicon layer to crystallize these regions into a crystallization region.

Heat-treating the substrate is preferably performed at a temperature in a range of 400 to 800° C. for 1 to 3,000 minutes. The first pattern layer preferably includes a silicon oxide layer and the second pattern layer includes a silicon nitride layer. The metal catalyst layer preferably includes a metal catalyst in a concentration in a range of $10^{11}$ to $10^{15}$ atoms/cm$^2$.

Yet another exemplary embodiment of the present invention provides a flat panel display, including: a substrate; a semiconductor layer whose longitudinal direction is either parallel to or perpendicular to a growth direction of a crystallization region grown from an at least 400 μm$^2$ seed region, the semiconductor layer being arranged on the substrate and formed by patterning the crystallization region; gate electrodes arranged on the semiconductor layer and insulated; and source and drain electrodes contacting the semiconductor layer and insulated from the gate electrodes.

The flat panel display preferably further includes a first electrode electrically connected to the source and drain electrodes.

The crystallization region is preferably crystallized using a Super Grain Silicon (SGS) crystallization technique. The growth direction is preferably the same as a direction of a grain boundary of the crystallization region.

BRIEF DESCRIPTION OF THE DRAWINGS

A more complete appreciation of the present invention and many of the attendant advantages thereof, will be readily apparent as the present invention becomes better understood by reference to the following detailed description when considered in conjunction with the accompanying drawings in which like reference symbols indicate the same or similar components, wherein.

DETAILED DESCRIPTION OF THE INVENTION

The present invention is described more fully hereinafter with reference to the accompanying drawings, in which exemplary embodiments of the present invention are shown.

FIGS. 1A to 1F are cross-sectional views of a method of forming a polycrystalline layer according to an exemplary embodiment of the present invention.

Figure 1A:
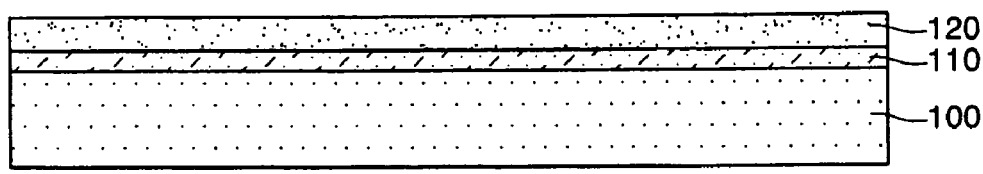
FIGS. 1A to 1F are cross-sectional views of a method of forming a polycrystalline layer according to an exemplary embodiment of the present invention.

Referring to FIG. 1A, a buffer layer 110 is formed on a transparent insulating substrate 100, such as a glass or plastic substrate.

The buffer layer 110 serves to inhibit moisture and impurities generated on the substrate from diffusing into a device to be formed later, and to regulate a heat transmission rate during crystallization, thereby carrying out the crystallization of a semiconductor layer well.

Furthermore, an amorphous silicon layer 120 is formed on the buffer layer 110 by Physical Vapor Deposition (PVD) or Chemical Vapor Deposition (CVD).

Figure 1B:
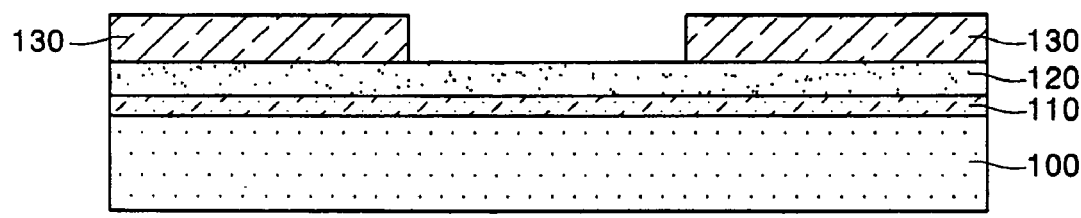

Referring to FIG. 1B, a first pattern layer 130 including a silicon oxide layer which prevents diffusion of a metal catalyst is formed on the amorphous silicon layer 120.

The first pattern layer 130 is formed to expose a predetermined region of the amorphous silicon layer 120. The first pattern layer 130 is formed to a thickness of 50 to 5,000 Å.

Figure 1C:
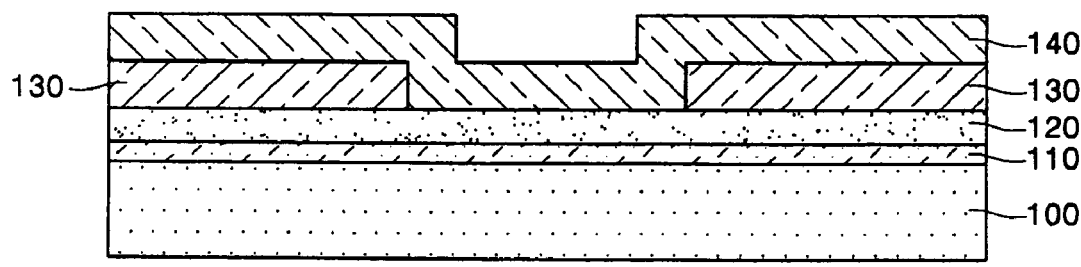

Referring to FIG. 1C, a second pattern layer 140 is formed over the entire surface of the substrate 100 having the first pattern layer 130.

The second pattern layer 140 includes a silicon nitride layer to enable diffusion of a metal catalyst, and has a thickness of 50 to 5,000 Å. The second pattern layer 140 is formed to entirely cover the amorphous silicon layer 120 exposed by the first pattern layer 130.

Figure 1D:
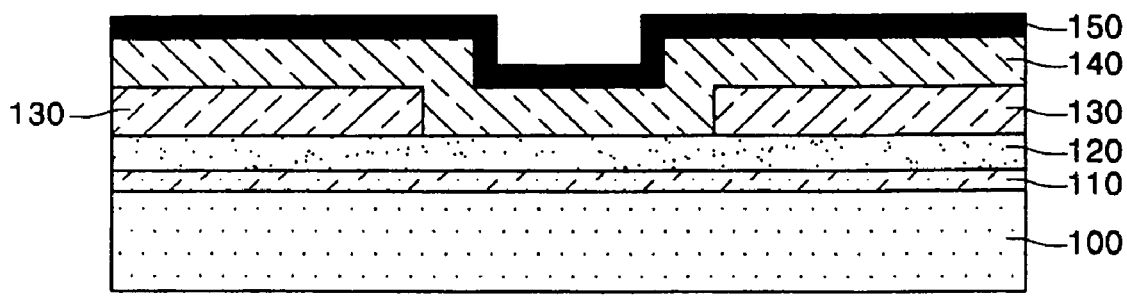

Referring to FIG. 1D, a metal catalyst layer 150 is formed on the second pattern layer 140.

The metal catalyst layer 150 is formed using a metal selected from the group consisting of Ni, Pd, Ti, Ag, Au, Al, Sn, Sb, Cu, Co, Mo, Cr, Ru, Rh, Cd and Pt.

The metal catalyst layer 150 is formed to have a concentration of $10^{11}$ to $10^{15}$ atoms/cm$^2$. This is because the extent of crystallization of the amorphous silicon layer 120 varies depending on the concentration of the metal catalyst layer 150. When the metal catalyst layer 150 is formed to have a very high concentration, a grain size of a polycrystalline silicon layer not only becomes finer, but an amount of metal catalyst remaining on the polycrystalline silicon layer increases. Therefore, the characteristics of the polycrystalline silicon layer deteriorate. When the metal catalyst layer 150 is formed to have a very low concentration, it is difficult to deposit the layer evenly with the present deposition apparatus and a seed is not sufficiently formed to crystallize the metal catalyst layer 150.

Figure 1E:
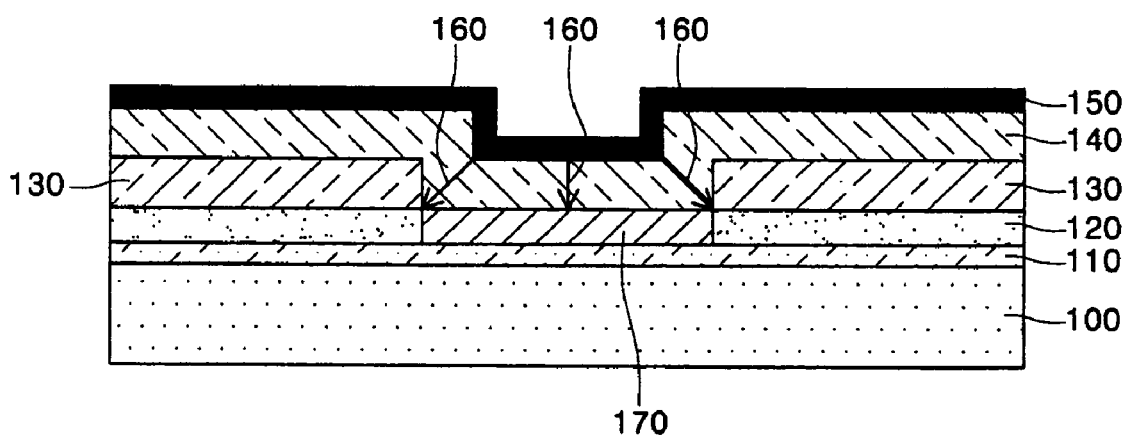

Referring to FIG. 1E, a metal catalyst in the metal catalyst layer 150 diffuses into a predetermined region of the amorphous silicon layer 120 by heat-treating the substrate 100 including the amorphous silicon layer 120, the first pattern layer 130, the second pattern layer 140 and the metal catalyst layer 150.

The diffused metal catalyst forms a seed (not illustrated), and the predetermined region of the amorphous silicon layer 120 is crystallized into a seed region.

The formation of the seed region 170 is affected by the diffusion of the metal catalyst. In order to form the seed region, the metal catalyst is easily diffused 160 into the second pattern layer 140 but not into the first pattern layer 130.

The metal catalyst of the metal catalyst layer 150 diffuses into the amorphous silicon layer 120 by heat-treating, so that the seed is formed. Accordingly, the metal catalyst remains on the seed region 170 after crystallization in a concentration of $1 \times 10^{13}$ atoms/cm$^2$ or less.

The seed region 170 is a polycrystalline silicon layer crystallized using an SGS crystallization technique. That is, as described above, the SGS crystallization technique includes the steps of: sequentially stacking the amorphous silicon layer, the second pattern layer enabling diffusion of the metal catalyst, and the metal catalyst layer on a substrate 100; diffusing the metal catalyst into the amorphous silicon layer through the second pattern layer by heat-treating the substrate 100, and then forming a seed; and crystallizing the amorphous silicon layer by the seed.

The grains of a polycrystalline silicon layer of the seed region 170 radially grow at the respective seeds to take a slightly irregular circular shape and each grain boundary also has a slightly irregular circular shape. A plurality of grains are formed in the seed region 170, but the positions and the number of seeds are not controlled. As a result, growth directions of crystals are random in the seed region 170, and the directions of grain boundaries are random in the seed region as well.

Figure 1F:
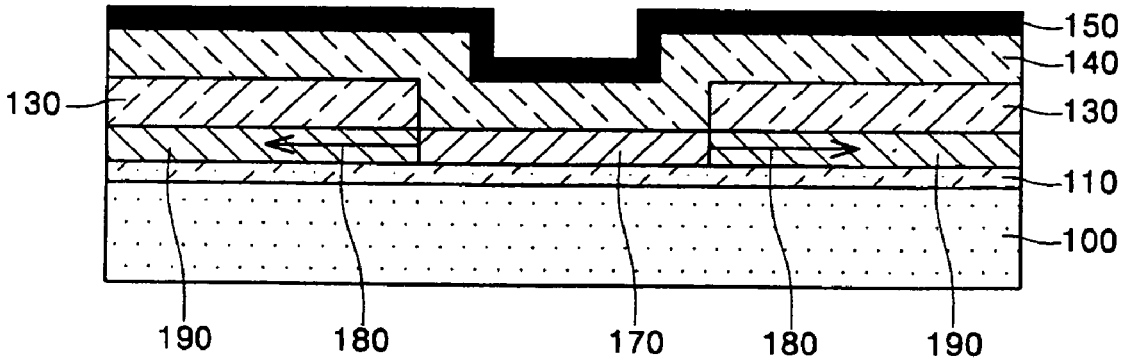

Referring to FIG. 1F, the amorphous silicon layer below the first pattern layer 130 is formed into a crystallization region 190 by causing the crystallinity of the seed region 170 to spread.

The crystallization region 190 is directly affected by the seed region 170. That is, the crystallization region 190 is grown by the spread of the crystallinity of the seed region 170, so as to be affected by the crystalline size and crystallization direction of the seed region 170.

However, the seed is not formed in the crystallization region 190, unlike in the seed region 170, so that the metal catalyst hardly exists there.

Also, the grain boundary of the crystallization region 190 is radially formed around the seed region 170.

The seed region 170 and the crystallization region 190 are crystallized at a temperature of about 400 to 800° C. for 1 to 3,000 minutes.

FIGS. 2A to 2F are cross-sectional views of a method of forming a polycrystalline silicon layer according to another exemplary embodiment of the present invention.

Figure 2A:
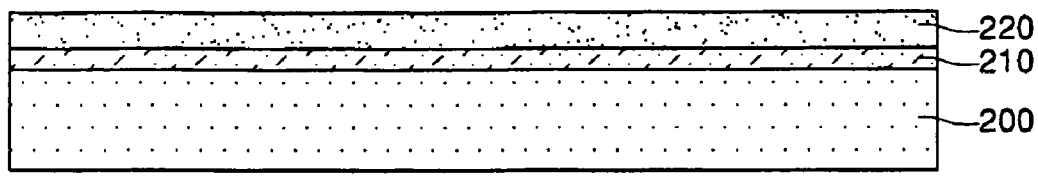
FIGS. 2A to 2F are cross-sectional views of a method of forming a polycrystalline silicon layer according to another exemplary embodiment of the present invention.

Referring to FIG. 2A, a buffer layer 210 is formed on a transparent insulating substrate 200, such as a glass or plastic substrate.

The buffer layer 210 serves to inhibit moisture or impurities generated on the substrate from diffusing into a device to be formed later or to well crystallize a semiconductor layer by regulating a thermal transmission rate during crystallization.

Subsequently, an amorphous silicon layer 220 is formed on the buffer layer 210 by a PVD or CVD method.

Figure 2B:
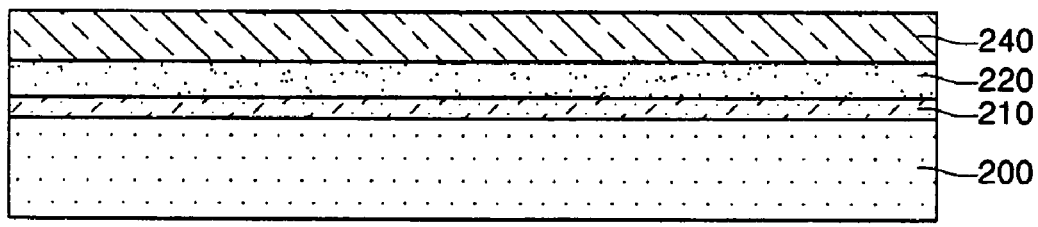

Referring to FIG. 2B, a second pattern layer 240 is formed on the amorphous silicon layer 220 to enable diffusion of a metal catalyst.

The second pattern layer 240 includes a silicon nitride layer and has a thickness of 50 to 5,000 Å.

Figure 2C:
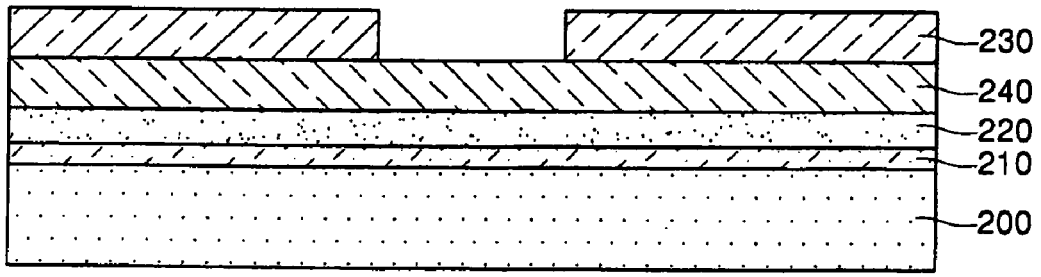

Referring to FIG. 2C, a first pattern layer 230 is formed on the second pattern layer 240 to expose the amorphous silicon layer 220 through a predetermined region thereof, the amorphous silicon layer 220 being below the second pattern layer 240.

The first pattern layer 230 includes a silicon oxide layer which does not diffuse a metal catalyst and has a thickness of 50 to 5,000 Å.

Figure 2D:
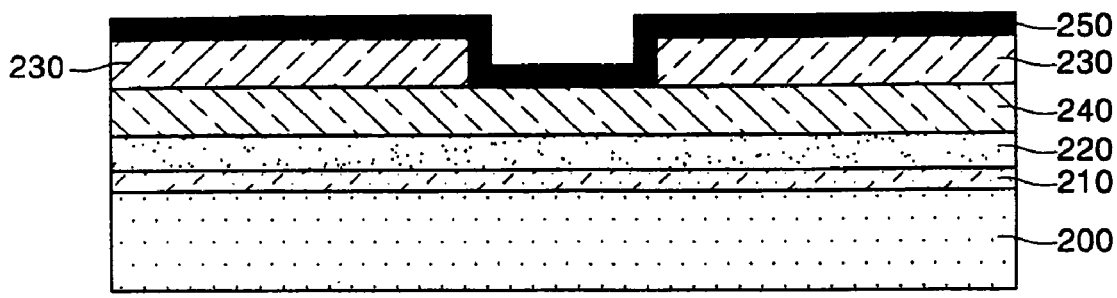

Referring to FIG. 2D, a metal catalyst layer 250 is formed on the substrate including the first pattern layer 230 and the second pattern layer 240.

The metal catalyst layer 250 is formed of at least one metal selected from the group consisting of Ni, Pd, Ti, Ag, Au, Al, Sn, Sb, Cu, Co, Mo, Cr, Ru, Rh, Cd and Pt.

In addition, the metal catalyst layer 250 is formed to have a concentration of $10^{11}$ to $10^{13}$ atoms/cm$^2$. This is because the extent of crystallization of the amorphous silicon layer 220 varies depending on the concentration of the metal catalyst layer 250. When the metal catalyst layer 250 is formed to have a very high concentration, a grain size of a polycrystalline silicon layer not only becomes finer, but an amount of metal catalyst remaining on the polycrystalline silicon layer also increases, so that the characteristics of the polycrystalline silicon layer deteriorate. When the metal catalyst layer 250 is formed to have a very low concentration, it is difficult to deposit the layer evenly with the present deposition apparatus and a seed (crystallization nuclear) is not sufficiently formed to crystallize the metal catalyst layer 250.

Figure 2E:
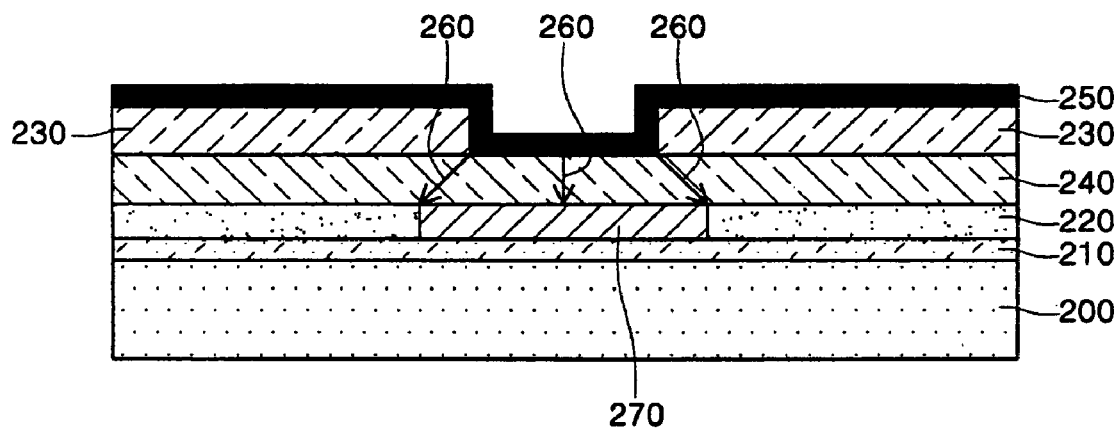

Referring to FIG. 2E, a metal catalyst in the metal crystal layer 250 diffuses 260 into a predetermined region of the amorphous silicon layer 220 by heat-treating the substrate including the amorphous silicon layer 220, the first pattern later 230, the second pattern layer 240, and the metal catalyst layer 250.

The diffused metal catalyst forms a seed (not illustrated), and a predetermined region of the amorphous silicon layer 220 is crystallized into a seed region 270 by the seed.

The formation of the seed region 270 is affected by the diffusion of the metal catalyst. The metal catalyst diffuses 260 easily into the second pattern layer 240 but not into the first pattern layer 230. That is, the metal catalyst of the metal catalyst layer 250 formed on the first pattern layer 230 does not diffuse, while the metal catalyst deposited on the second pattern layer 240 easily diffuses to reach the amorphous silicon layer 220.

The grains of a polycrystalline silicon layer of the seed region 270 radially grow at the respective seeds to take a slightly irregular circular shape and each grain boundary also has a slightly irregular circular shape. A plurality of grains are formed in the seed region 270, but the positions and the number of seeds are not regulated. As a result, crystal growth directions are random in the seed region 270 and the directions of grain boundaries are random in the seed region as well.

Figure 2F:
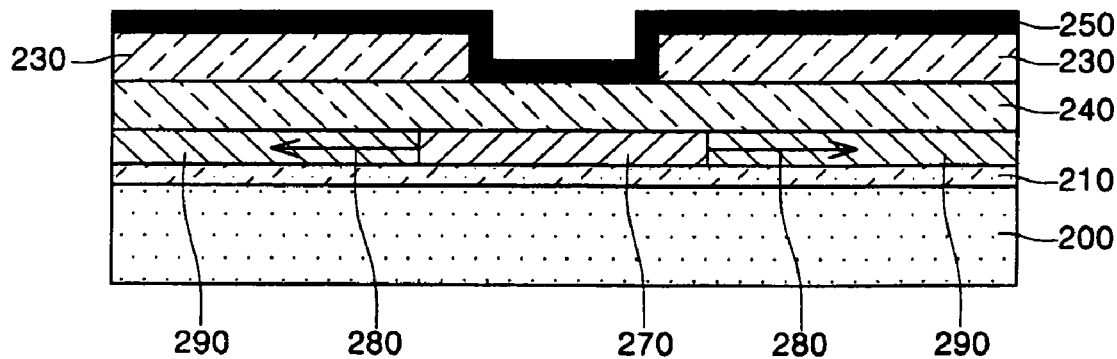

Referring to FIG. 2F, the amorphous silicon layer below the first pattern layer 230 is formed into a crystallization region 290 by the spread of the crystallinity in the seed region 270.

The crystallization region 290 is directly affected by the seed region 270. That is, since the crystallization region 290 is crystallized by the spread of the crystallinity of the seed region 270, it is affected by the crystalline size and crystallization direction of the seed region 270.

Also, the grain boundary of the crystallization region 290 is formed radially around the seed region 270.

The seed region 270 and the crystallization region 290 are crystallized at a temperature of about 400 to 800° C. for 1 to 3,000 minutes.

Figure 3:
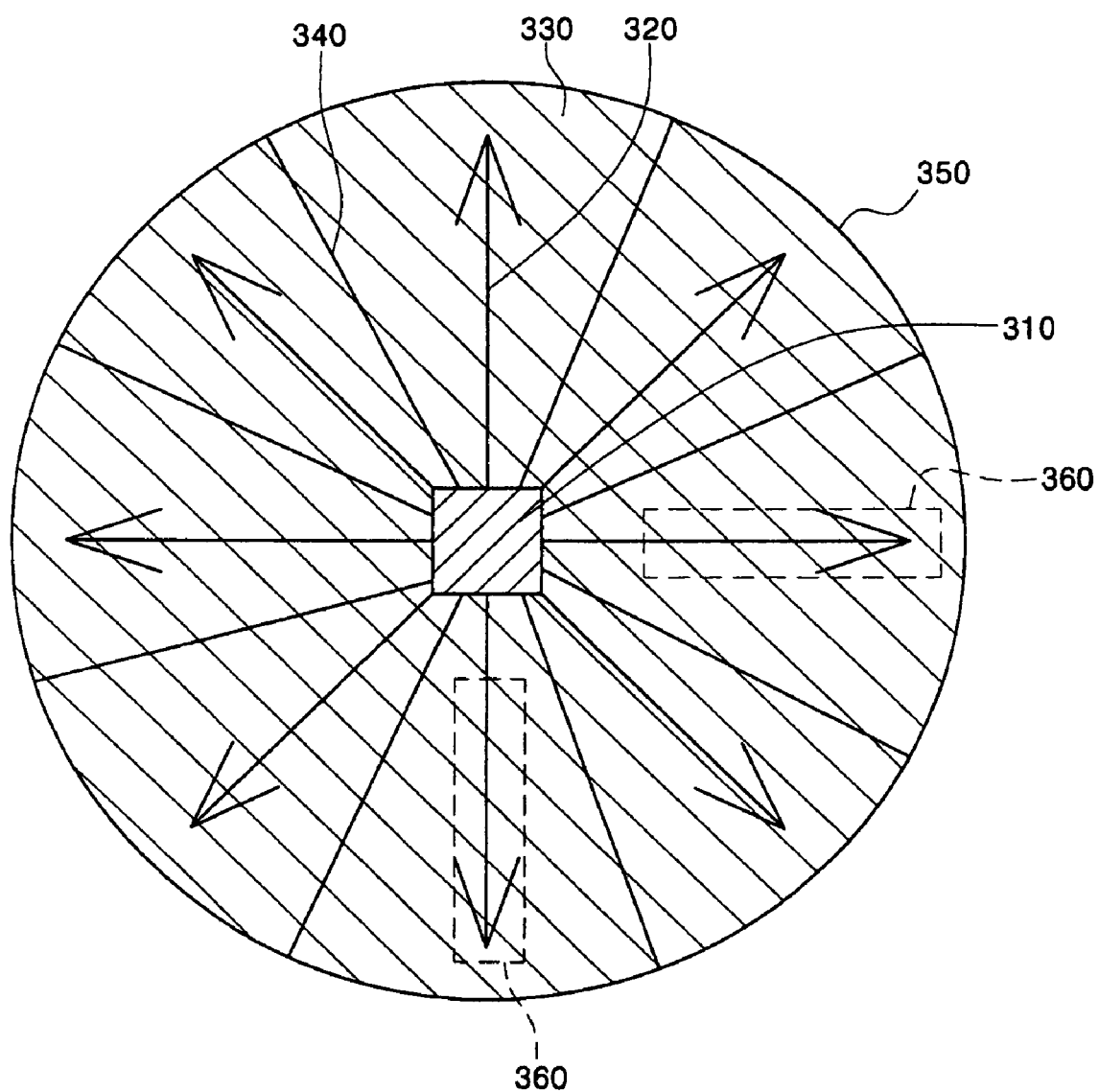
FIG. 3 is a plan view of a seed region and a crystallization region which are crystallized according to an exemplary embodiment of the present invention.

FIG. 3 is a plan view of a seed region and a crystallization region which are crystallized according to an exemplary embodiment of the present invention.

FIG. 3 shows the result after the amorphous silicon layer is crystallized into the polycrystalline silicon layer, and the metal catalyst layer, the first pattern layer and the second pattern layer are removed by the method described above with reference to FIGS. 1A to 1F or 2A to 2F.

When the substrate on which the amorphous silicon layer, the first and second pattern layers, and the metal catalyst layer are disposed is heat-treated, the metal catalyst of the metal catalyst layer is selectively diffused by the first and second pattern layers, and a seed (crystallization nuclear) is formed in a predetermined region of the amorphous silicon layer. The predetermined region of the amorphous silicon layer is formed into a seed region 310 by the seed.

In the exemplary embodiments of the present invention, the seed region 310 is formed in the shape of a square. This is accomplished by forming the first and second pattern layers, especially the first pattern layer, into a square. If necessary, the seed region 310 can be formed into a different shape such as a triangle, a rectangle, a polygon or a circle.

The seed region 310 is crystallized using an SGS crystallization technique such that crystals grow around the seed as described above and grain boundaries inside of the seed region 310 are random.

Accordingly, when a semiconductor layer of a thin film transistor is formed by patterning the seed region 310, the characteristics of the thin film transistor are not uniform due to impurities, such as the metal catalyst, the seed and the gain boundaries formed randomly.

However, the seed region 310 is different from a crystallization region 330 grown radially around the seed region 310.

That is, the crystallization region 330 grows 320 from the seed region 310 so that grains grow in a specific direction, and a low angle grain boundary 340 in the crystallization region 330 is also formed around the seed region 310 in the specific direction, such as a radial direction, and a high angle grain boundary 350 becomes a boundary region of the crystallization region 330. In other words, the high angle grain boundary 350 becomes a boundary line between different crystallization regions grown from different seed regions or between the crystallization region and the amorphous silicon region which is not crystallized. And, the low angle grain boundary 340 becomes a boundary line of grains with different crystallinities inside a single crystallization region.

Consequently, as shown in FIG. 3, when the semiconductor layer of the thin film transistor is formed by patterning a predetermined region 360 in the crystallization region 330 such that the direction of growth, i.e., the direction of the low angle grain boundary 340, is the longitudinal direction of the semiconductor layer, the semiconductor layer has substantially the same characteristics of another semiconductor layer which is formed by the same method, because its crystal grains point in the same direction as carriers moving in a channel. Also, it has characteristics similar to a single crystal according to these grain characteristics. As a result, it is possible to obtain a thin film transistor with excellent uniform characteristics.

Also, the semiconductor layer of the thin film transistor can be formed by patterning the predetermined region of the crystallization region 330 such that the longitudinal direction is perpendicular to the growth direction, i.e., the direction of the low angle grain boundary 340.

While the thin film transistor having the semiconductor layer patterned to be perpendicular to the growth direction 320 can have a lower electron mobility than the thin film transistor including the semiconductor layer which does not have grain boundaries, it is more uniform.

FIGS. 4A to 4D are photographs of crystallization lengths of a crystallization region depending on an area of a seed region according to an embodiment of the present invention.

Referring to FIGS. 4A to 4D, the seed regions 170 and 270, as stated with reference to FIGS. 1A to 1F or 2A to 2F, were formed to have different areas, and the respective crystallization regions 190 and 290 were formed by spreading of the respective seed regions 170 and 270.

Figure 4A:
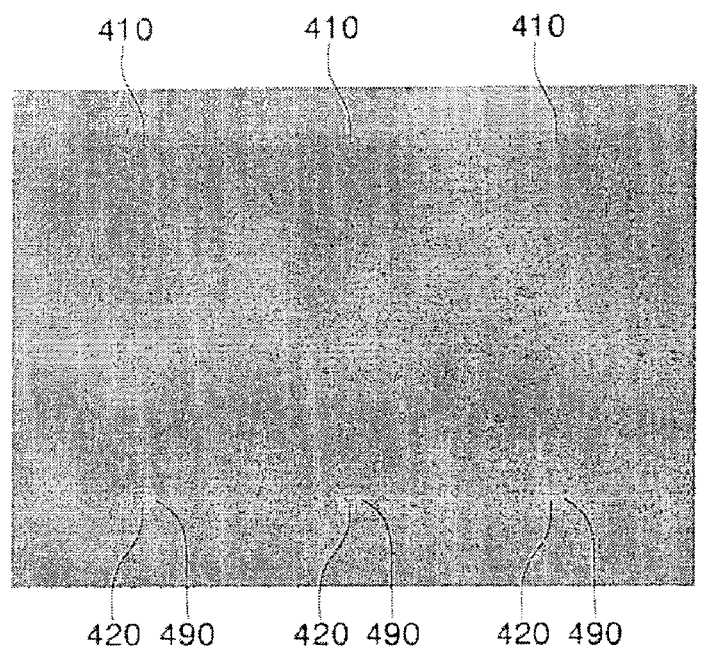
FIGS. 4A to 4D are photographs of crystallization lengths of the crystallization region depending on the area of the seed region according to an exemplary embodiment of the present invention.

At the top of FIG. 4A, a seed region 410 was formed to be 10 by 10 μm (100 μm$^2$), and at the bottom, a seed region 420 was formed to be 20 by 20 μm (400 μm$^2$).

Figure 4B:
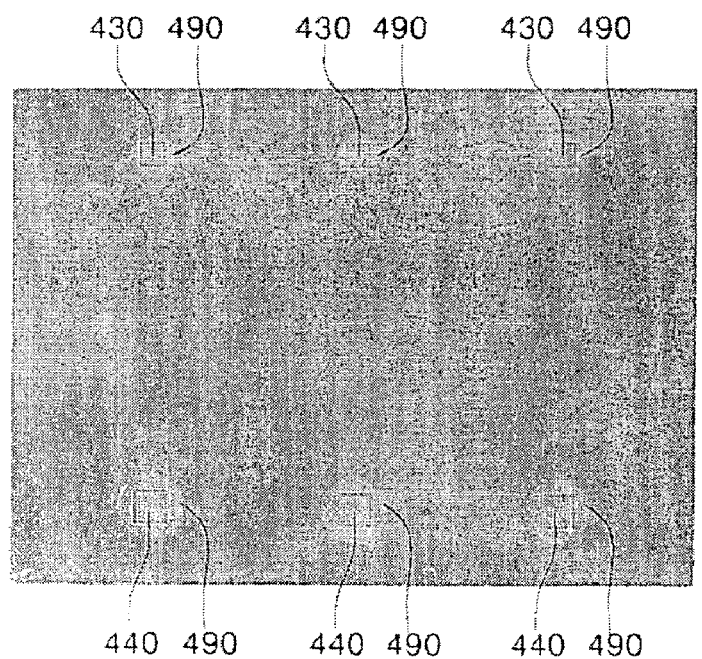

Also, at the top of FIG. 4B, a seed region 430 was formed to be 30 by 30 μm (900 μm$^2$), and at the bottom, a seed region 440 was formed to be 40 by 40 μm (1,600 μm$^2$).

Figure 4C:
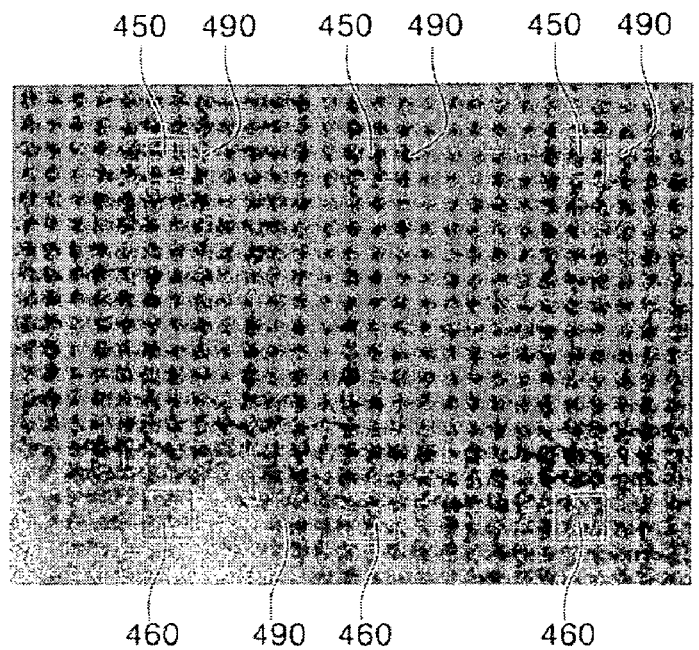

Moreover, at the top of FIG. 4C, a seed region 450 was formed to be 50 by 50 μm (2,500 μm$^2$), and at the bottom, a seed region 460 was formed to be 60 by 60 μm (3,600 μm$^2$).

Figure 4D:
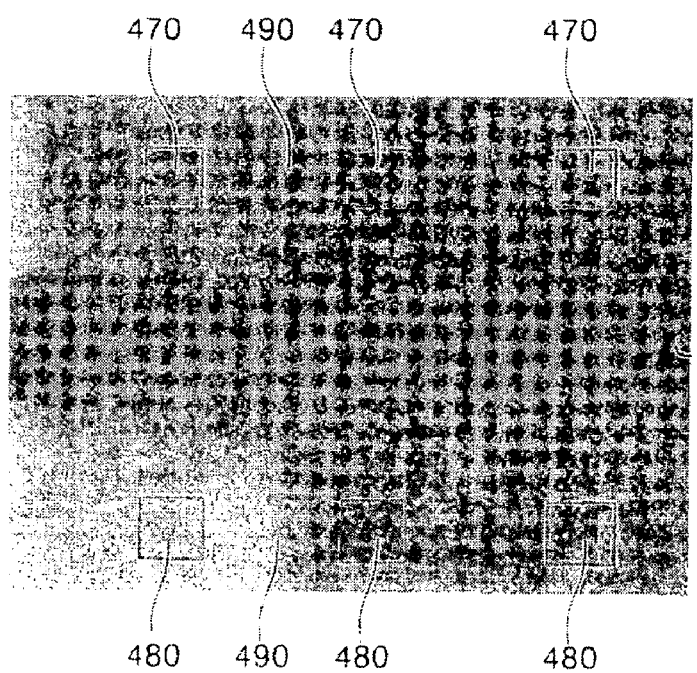

In addition, at the top of FIG. 4D, a seed region 470 was formed to be 70 by 70 μm (4,900 μm$^2$), and at the bottom, a seed region 480 was formed to be 80 by 80 μm (6400 μm$^2$).

With the seed area 410 having an area of 100 μm$^2$ at the top of FIG. 4A, a crystallization region did not form, while with the seed region 420 having an area of 400 μm$^2$ at the bottom of FIG. 4A, a crystallization region 490 started to form.

This shows that growth of the crystallization region 490 is directly affected by the areas of the seed regions 420 to 480. Specifically, it can be shown that the growth length or area of the crystallization region 490 is proportional to the area of the seed region.

Figure 5:
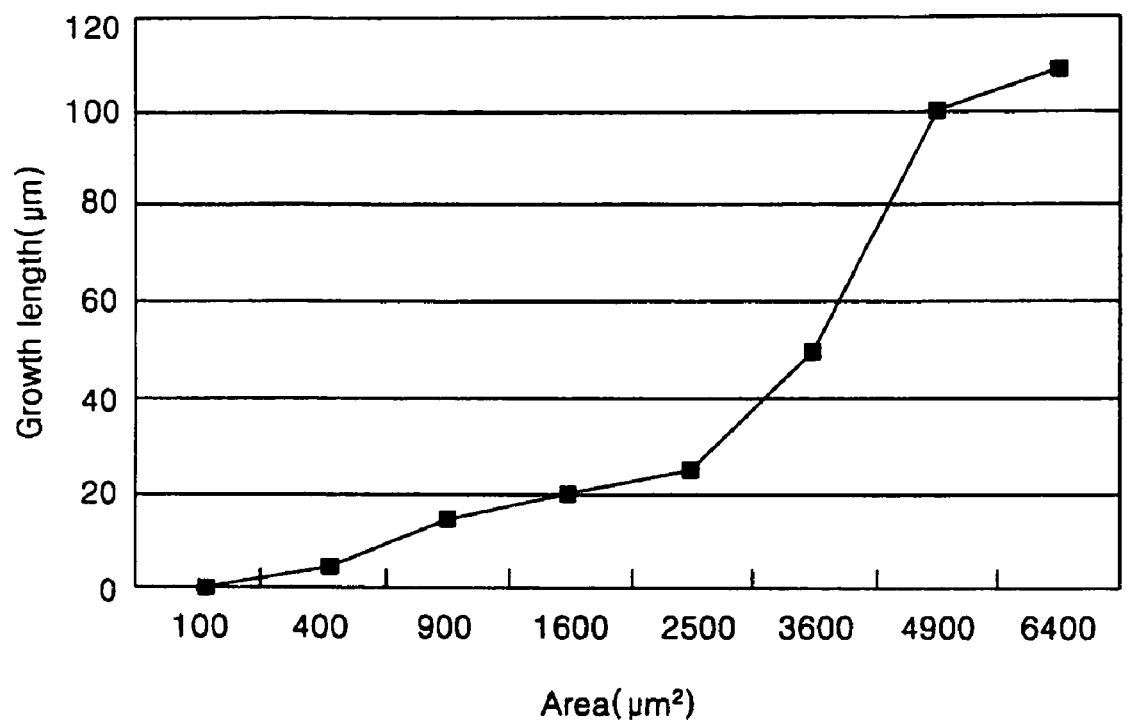
FIG. 5 is a graph of growth lengths of the crystallization regions of FIGS. 4A to 4D.

FIG. 5 is a graph of growth lengths of the crystallization regions of FIGS. 4A to 4D.

Referring to FIG. 5, for the seed regions 410 to 480 having areas 100 μm$^2$, 400 μm$^2$, 900μm$^2$, 1600 μm$^2$, 2500 μm$^2$, 3600 μm$^2$, 4900 μm$^2$ and 6400 m$^2$, respectively, the growth lengths of the crystallization region are about 0, 5 μm, 15 μm, 20 μm, 25 μm, 50 μm, 100 μm and 110 μm, respectively.

Thus, it is shown that the crystallization region 490 can be formed when an amorphous silicon layer is crystallized using an SGS crystallization technique and the square-shaped seed regions 410 to 480 are formed to be at least 400 μm$^2$.

Accordingly, it is shown that when the amorphous silicon layer is crystallized into the polycrystalline silicon layer, as described with reference to FIGS. 1A to 1F or 2A to 2F, the first pattern layer 130 or 230 and the second pattern layer 140 or 240 are formed to make the seed regions 170 and 270 have areas of at least 400 μm$^2$.

Figure 6A:
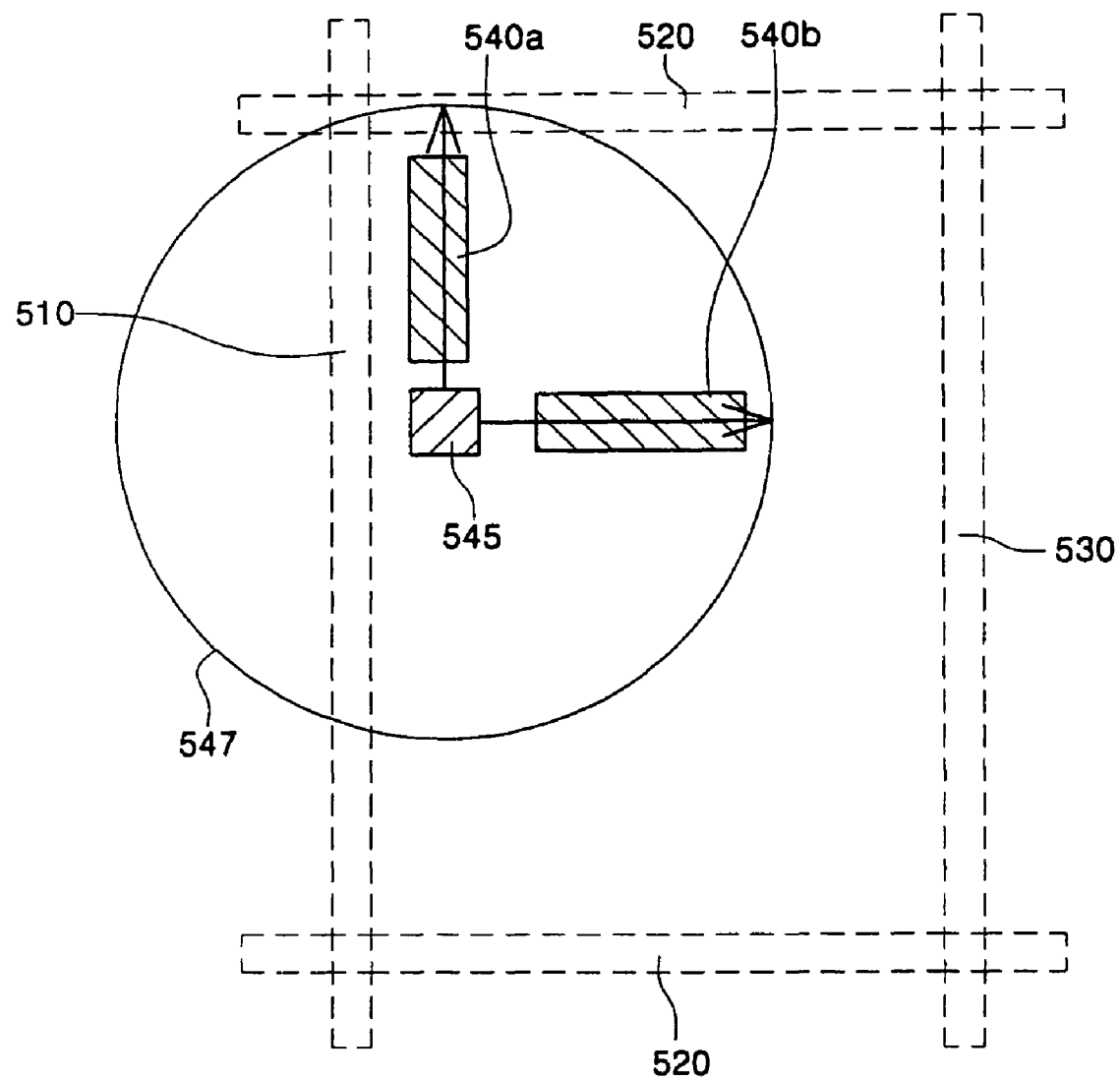
FIGS. 6A and 6B are cross-sectional views of a method of fabricating a flat panel display by forming a semiconductor layer on the crystallization region according to an exemplary embodiment of the present invention.
Figure 6B:
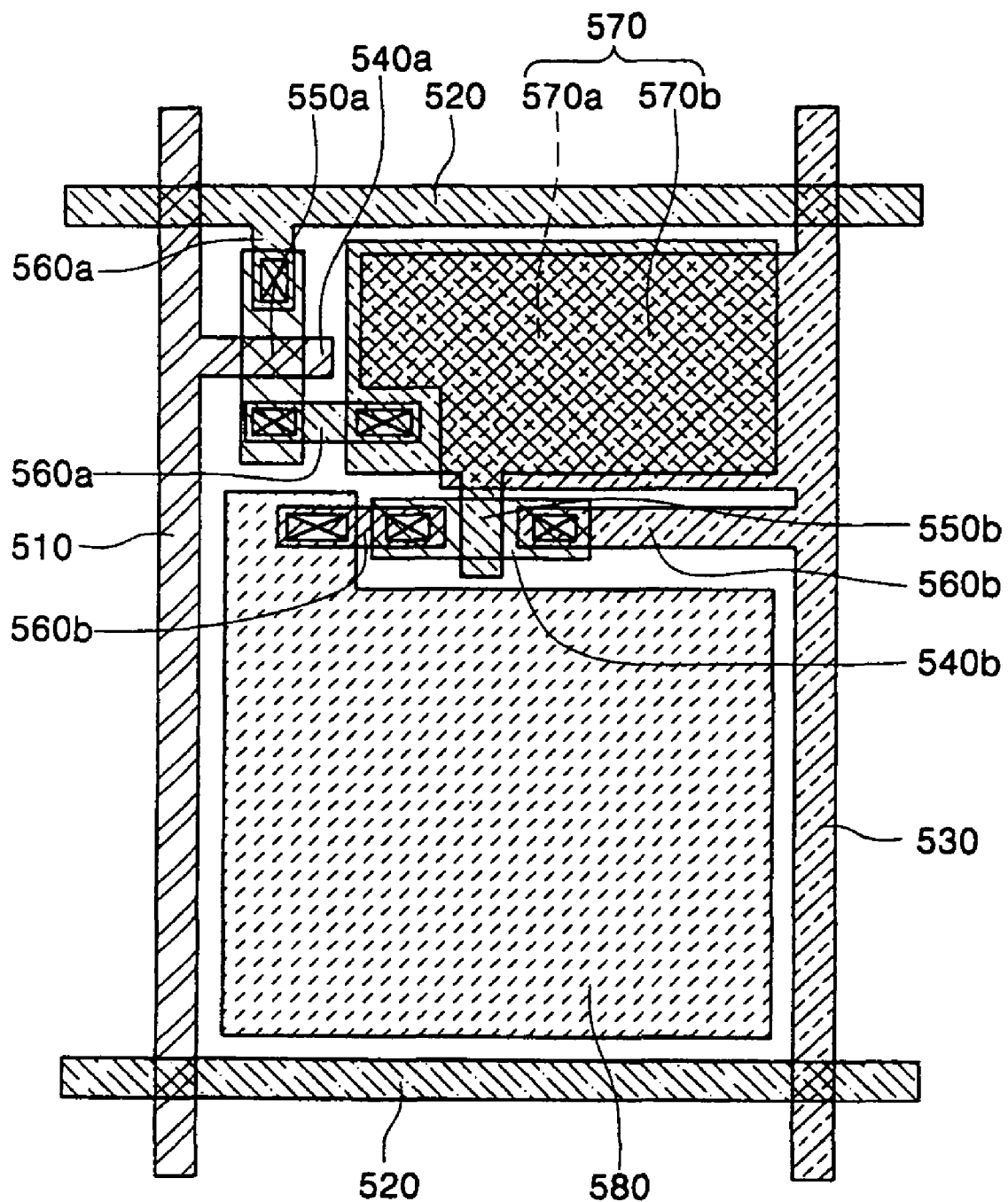

FIGS. 6A and 6B are cross-sectional views of a method of fabricating a flat panel display by forming a semiconductor layer in a second crystallization region in accordance with an embodiment of the present invention.

Referring to FIGS. 6A and 6B, when semiconductor layers 540a and 540b are formed in predetermined regions inside an unit pixel which is defined by forming a scan line 510, a data line 520 and a common power line 530 on a substrate, regions for disposing the semiconductor layers 540a and 540b are determined in advance, and an amorphous silicon layer is formed on the substrate.

Next, a first pattern layer, a second pattern layer and a metal catalyst layer are formed on the amorphous silicon layer by the same method as described above.

The first and second patterns, and the metal catalyst layer are dependant on regions to be formed with the semiconductor layers 540a and 540b and longitudinal directions of the semiconductor layers. This is because a seed region 545 is formed and then a crystallization region 547 resulting from spread of the seed region 545 is patterned in order to form the semiconductor layers 540a and 540b in the same positions and directions as illustrated in FIG. 6A.

As a result, according to positions and directions for forming the semiconductor layers 540a and 540b, the seed region 545 is formed, and the first and second pattern layers, and the metal catalyst layer are formed. However, the semiconductor layers 540a and 540b are formed inside of the crystallization region 547 and then patterned in consideration of a grain growth direction.

In FIG. 6A, the semiconductor layers 540a and 540b are patterned in the same direction as the growth direction, but if necessary, they can be patterned perpendicular to the growth direction.

Subsequently, as shown in FIG. 6B, a gate insulating layer (not shown), the scan line 510, the data line 520, the common power liner 530, gate electrodes 550a and 550b, source and drain electrodes 560a and 560b, a capacitor 570 including upper and lower electrodes 570b and 570a, a first electrode 580, an organic film layer (not shown) including at least an organic emission layer, and a second electrode (not shown) are formed.

An interlayer insulating layer or a planarization layer can also be formed in order to protect, insulate or planarize devices or layers.

Consequently, the present invention provides a polycrystalline silicon layer having regulated grains and grain boundaries by forming a seed region and a crystallization region in a desired region using first and second pattern layers. Also, a thin film transistor can be fabricated to have excellent characteristics by using the polycrystalline silicon layer, and a flat panel display having excellent characteristics can be formed using the thin film transistor.

While exemplary embodiments of the present invention have been described herein, it will be clear to those of ordinary skill in the art that various modifications in form and detail can be made to the described embodiments without departing from the spirit and scope of the present invention as defined by the appended claims.

What is claimed is:

1. A polycrystalline silicon layer, comprising:
   a substrate;
   a seed region at least 400 $\mu m^2$ in size; and
   a crystallization region grown from the seed region, the crystallization region and the seed region being located on the substrate;
   wherein a shape of the seed region is a square and wherein grain boundaries of the crystallization region are radially centered on the seed region, the square being a plane rectangle with four equal sides and four right angles, the seed region and the crystallization region being mutually exclusive, and the seed region comprising a metal catalyst having a concentration of $1 \times 10^3$ atoms/$cm^2$ or less.

2. The polycrystalline silicon layer according to claim 1, wherein the seed region is crystallized using a Super Grain Silicon (SGS) crystallization technique.

3. The polycrystalline silicon layer according to claim 1, wherein the crystallization region is crystallized by growth of the seed region.

4. The polycrystalline silicon layer according to claim 1, wherein the seed region comprises a seed.

5. The polycrystalline silicon layer according to claim 4, wherein the seed comprises the metal catalyst.

6. The polycrystalline silicon layer according to claim 1, wherein the seed region comprises:
   a first pattern layer arranged on an amorphous silicon layer to expose a predetermined region of the amorphous silicon layer;
   a second pattern layer arranged on the first pattern layer and contacting the predetermined region of the amorphous silicon layer; and
   a metal catalyst layer arranged on the second pattern layer;
   wherein the substrate with the first pattern layer, the second pattern layer and the metal catalyst layer is heat-treated and the exposed predetermined region of the amorphous silicon layer is crystallized to form the seed region.

7. The polycrystalline silicon layer according to claim 6, wherein the first pattern layer comprises a silicon oxide layer.

8. The polycrystalline silicon layer according to claim 7, wherein the silicon oxide layer has a thickness in a range of 50 to 5,000 Å.

9. The polycrystalline silicon layer according to claim 6, wherein the second pattern layer comprises a silicon nitride layer.

10. The polycrystalline silicon layer according to claim 9, wherein the silicon nitride layer has a thickness in a range of 50 to 5,000 Å.

11. The polycrystalline silicon layer according to claim 1, wherein the seed region comprises:
    a second pattern layer ranged on an amorphous silicon layer;
    a first pattern layer arranged on the second pattern layer and exposing a predetermined region of the amorphous silicon layer; and
    a metal catalyst layer ranged on the second pattern layer;
    wherein the substrate with the second pattern layer, the first pattern layer and the metal catalyst layer is heat-treated and the exposed predetermined region of the amorphous silicon layer is crystallized to form the seed region.

12. The polycrystalline silicon layer according to claim 11, wherein the first pattern layer comprises a silicon oxide layer.

13. The polycrystalline silicon layer according to claim 12, wherein the silicon oxide layer has a thickness in a range of 50 to 5,000 Å.

14. The polycrystalline silicon layer according to claim 11, wherein the second pattern layer comprises a silicon nitride layer.

15. The polycrystalline silicon layer according to claim 14, wherein the silicon nitride layer has a thickness in a range of 50 to 5,000 Å.

16. A method of fabricating a thin film transistor based on a polycrystalline silicon layer, the method comprising:
    forming an amorphous silicon layer on a substrate;
    forming a first pattern layer exposing at least 400 $\mu m^2$ of the amorphous silicon layer;
    forming a second pattern layer contacting a portion of the amorphous silicon layer, said portion of the amorphous silicon layer is exposed by the first pattern layer;
    forming a metal catalyst layer on the second pattern layer;
    heat-treating the substrate to form a seed in the exposed amorphous silicon layer, to crystallize the exposed amorphous silicon layer to form a seed region from the seed, and to cause the crystallinity of the seed region to spread to unexposed regions of the amorphous silicon layer to form a crystallization region, the seed region and the crystallization region being mutually exclusive, and grain boundaries of the crystallization region being radially centered on the seed region;

patterning the crystallization region to form a semiconductor layer in a rectangular shape, a lengthwise direction of the rectangular semiconductor layer being either parallel to or perpendicular to a growth direction of the crystallization region; and forming a thin film transistor based on the semiconductor layer.

17. The method according to claim 16, wherein heat-treating the substrate is performed at a temperature in a range of 400 to 800° C. for 1 to 3,000 minutes.

18. The method according to claim 16, wherein the first pattern layer comprises a silicon oxide layer and the second pattern layer comprises a silicon nitride layer.

19. The method according to claim 16, wherein the metal catalyst layer includes a metal catalyst in a concentration in a range of $10^{11}$ to $10^{15}$ atoms/cm$^2$ before the step of heat-treating the substrate.

20. A method of fabricating a polycrystalline silicon layer, the method comprising:

forming an amorphous silicon layer on a substrate;

forming a second pattern layer on the amorphous silicon layer;

forming a first pattern layer on top of the second pattern layer to expose at least 400 μm$^2$ of the second pattern layer;

forming a metal catalyst layer on the substrate; and heat-treating the substrate to form a seed in the amorphous silicon layer corresponding to the exposed second pattern layer, to crystallize an exposed amorphous silicon layer to form a seed region from the seed, and to cause the crystallinity of the seed region to spread to unexposed regions of the amorphous silicon layer to form a crystallization region;

wherein a shape of the seed region is a square and wherein grain boundaries of the crystallization region are radially centered on the seed region, the square being a plane rectangle with four equal sides and four right angles.

21. The method according to claim 20, wherein heat-treating the substrate is performed at a temperature in a range of 400 to 800° C. for 1 to 3,000 minutes.

22. The method according to claim 20, wherein the first pattern layer comprises a silicon oxide layer and the second pattern layer comprises a silicon nitride layer.

23. The method according to claim 20, wherein the metal catalyst layer includes a metal catalyst in a concentration in a range of $10^{11}$ to $10^{15}$ atoms/cm$^2$ before the step of heat-treating the substrate.

24. A flat panel display, comprising:

a substrate;

a rectangular semiconductor layer formed on the substrate, a direction along one side of the rectangular semiconductor layer is either parallel to or perpendicular to a growth direction of a crystallization region of a polycrystalline silicon layer grown from an at least 400 μm$^2$ seed region of the polycrystalline silicon layer, the semiconductor layer being formed inside the crystallization region, and the crystallization region and the seed region being positioned in the same horizontal plane which is parallel to a major surface of the substrate and being mutually exclusive;

gate electrodes ranged On the semiconductor layer and insulated; and source and drain electrodes contacting the semiconductor layer and insulated from the gate electrodes;

wherein the crystallization region is crystallized using a Super Grain Silicon (SGS) crystallization technique; and wherein a shape of the seed region is a square and wherein grain boundaries of the crystallization region are radially centered on the seed region, the square being a plane rectangle with four equal sides and four right angles.

25. The flat panel display according to claim 24, further comprising a first electrode electrically connected to the source and drain electrodes.

26. The flat panel display according to claim 24, wherein the growth direction is the same as a direction of a grain boundary of the crystallization region.

* * * * *